United States Patent
Dalipi et al.

(10) Patent No.: US 9,735,811 B2
(45) Date of Patent: Aug. 15, 2017

(54) DIGITAL PREDISTORTION OF NON-LINEAR DEVICES

(75) Inventors: Spendim Dalipi, Sollentuna (SE); Stefan Hamrin, Åkersberga (SE); Tobias Johansson, Stockholm (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 341 days.

(21) Appl. No.: 13/988,533

(22) PCT Filed: Nov. 22, 2010

(86) PCT No.: PCT/SE2010/051286
§ 371 (c)(1),
(2), (4) Date: May 21, 2013

(87) PCT Pub. No.: WO2012/070988
PCT Pub. Date: May 31, 2012

(65) Prior Publication Data
US 2013/0243119 A1    Sep. 19, 2013

(51) Int. Cl.
*H04B 1/04* (2006.01)
*H03F 1/32* (2006.01)
*H04L 27/36* (2006.01)

(52) U.S. Cl.
CPC ......... *H04B 1/0475* (2013.01); *H03F 1/3247* (2013.01); *H04L 27/368* (2013.01); *H04B 2001/0425* (2013.01)

(58) Field of Classification Search
USPC ......... 375/295, 296, 297
See application file for complete search history.

(56) References Cited

U.S. PATENT DOCUMENTS

| | | |
|---|---|---|
| 2004/0142667 A1 | 7/2004 | Lochhead et al. |
| 2005/0163250 A1 | 7/2005 | McCallister |
| 2006/0023807 A1 | 2/2006 | Shako et al. |
| 2007/0153884 A1* | 7/2007 | Balasubramanian et al. ............... 375/221 |
| 2008/0144539 A1* | 6/2008 | Sperlich et al. ............ 370/278 |
| 2010/0014609 A1* | 1/2010 | Ishikawa et al. ............ 375/297 |

FOREIGN PATENT DOCUMENTS

| | | |
|---|---|---|
| CN | 101647195 A | 2/2010 |
| EP | 2141800 A1 | 1/2010 |
| WO | 0108295 A1 | 2/2001 |

OTHER PUBLICATIONS

Dictionary.com definition of "predetermine".*

* cited by examiner

*Primary Examiner* — Kevin M Burd
(74) *Attorney, Agent, or Firm* — Murphy, Bilak & Homiller, PLLC

(57) ABSTRACT

A method and apparatus for compensating for nonlinearities in a non-linear device for manipulating a signal is described. Shortly before an initial discrete power increase is applied to the device, a first pre-distortion function is generated on the basis of a first set of DPD parameters and applied to the signal before it reaches the device. A predetermined time period after the initial power increase, the first pre-distortion function stops being applied to the signal, and a second pre-distortion function is generated on the basis of a second set of DPD parameters and applied to the signal. Shortly before a subsequent discrete power increase is applied to the device, the first pre-distortion function is generated on the basis of the first set of DPD parameters and applied to the signal.

16 Claims, 4 Drawing Sheets

DIGITAL PREDISTORTION OF NON-LINEAR DEVICES

TECHNICAL FIELD

The present invention relates to digital pre-distortion of non-linear devices. In particular, the invention relates to digital pre-distortion of power amplifiers in network nodes such as base stations which deal with traffic in bursts.

BACKGROUND

Spectral efficiency is increasingly important in today's mobile communications. The non-constant envelope (high peak-to-average ratio) digital modulation schemes used in many 2.5G and 3G wireless systems make RF power amplifier (PA) linearity and efficiency a crucial design issue. Typically, linearity is achieved either by reducing efficiency or by using linearization techniques. For a Class A PA, simply 'backing off' the input can improve linearity, but this reduces power efficiency and increases heat dissipation. When considering the vast numbers of base stations wireless operators need to account for, increased power consumption is not a realistic possibility, and linearization techniques are therefore required.

Digital pre-distortion (DPD) has become the most important linearization technique for nonlinear devices such as Base Station Power Amplifiers and frequency mixers. The basic concept of a pre-distorter is to calculate the inverse nonlinearity function of the nonlinear device. The pre-distortion is applied to the baseband signal before modulation, up-conversion, and amplification by the PA, so as to reduce Intermodulation (IM). The nonlinear expression can be implemented with polynomials or Look-up Tables (LUTs). The nonlinearity function is usually a simplified Volterra series that characterizes the inputs together with the "memory effects" of the device for better linearization performance. When a PA is stimulated with signals with low average power variation, the learning of the DPD can reach quite good precision. Unfortunately, in practice, signals are very seldom continuous in power. They vary for each timeslot depending on different power schemes. Every time the power is applied (i.e. there is a transient in power) the DPD and PA will together generate a residual IM which is the mismatch of the pre-distorter spectrum and PA spectrum. The amount of transient IM is dependent on the difference in PA characteristics between the average state and transient state.

Consider, for example, a PA in a Base Station operating Time-Division Duplex (TDD). In TDD operation the PA will be turned off when transmission is not taking place, to reduce the noise in the receiver and unnecessary power consumption. This procedure means that the PA will be in a transition state during the whole TX transmitting period. This is illustrated in FIG. 1, which is a representation of a typical power output for such a PA varying with time. The signal 1 resembles a square wave, in which power is applied 2a, is then maintained at a high value for a short period of time 3a (for TX transmission) and is then switched off 4a. The TX transmission period 3a is too short for a steady state to be reached, so any DPD will need to change throughout the period of the TX transmission burst 3a. This process will need to be repeated for each TX burst 3b, 3c. One way of addressing this problem is to have a number of characterizations of the system as a function of temperature, current, input power, etc.

Existing approaches are often in terms of static DPD. The DPD is adapted with samples from somewhere in the transmit burst 3a which will probably be wrong for subsequent TX bursts 3b, 3c. There are other solutions to similar problems like multidimensional sets of DPD parameters, or equivalent. The linearization schemes would inevitably get very complicated and expensive and the performance would be dependent on the accuracy of these time varying constants.

Alternatively, the DPD parameters could be remembered from the end of one burst 4a and applied at the beginning of the next burst 2b. This is a compensation for a high power characteristic of the PA, but the PA has undergone a shut down in between. In other words, the PA may have reached a steady state of temperature, current etc. by the time the PA is shut down 4a. When it is re-activated 2b these conditions will be different as a result of the intervening shutdown, and this correction will not be sufficient to reduce the entire IM. A transient IM will then be left until either the DPD is updated or the PA behaviour changes back to the adapted state.

This can be understood with reference to FIG. 2, which illustrates how the IM can be reduced through the course of each burst 3a, 3b, 3c. If the state of the DPD (i.e. the values in the LUT or parameters in the polynomials) is remembered from the end of the previous burst, the transient IM at the start of the next burst will be large again, because the conditions at the start of the burst are different to the conditions at the end of the previous burst.

It would be desirable to design a DPD scheme in which the transient IM at the start of each burst is reduced.

SUMMARY

It is an object of the present invention to address, or at least alleviate, the problems described above.

In accordance with a first aspect of the present invention there is provided a signal manipulation unit for use in a network element of a telecommunications network. The signal manipulation unit comprises a non-linear device for manipulating the signal. A digital pre-distortion unit is provided for generating a pre-distortion function using stored parameters and applying it to the signal before it reaches the non-linear device so as to compensate for nonlinearities in the device. An adaptation unit is provided for receiving feedback from an output of the device and adapting the parameters in response to the received feedback. A storage unit is operatively connected to the adaptation unit and pre-distortion unit for storing the parameters. The digital pre-distortion unit comprises a function generator configured to generate a first pre-distortion function on the basis of a first set of parameters shortly before an initial discrete increase in power applied to the device. A signal distorter is configured to apply the first pre-distortion function to the signal. A clock is configured to determine a predetermined time period after the initial power increase. The pre-distortion unit is configured so that, after the predetermined time period, the function generator stops generating the first pre-distortion function and starts generating a second pre-distortion function on the basis of a second set of parameters. The pre-distortion unit is further configured so that, shortly before the start of a subsequent discrete increase in power applied to the device the function generator starts generating the first pre-distortion function on the basis of the first set of parameters.

The first pre-distortion function can thus be used to compensate for IM when the device is in a "transient" state, just after a sharp increase in power. Once the device has settled down, the second pre-distortion function can be used to compensate until the next sharp increase in power, when the first pre-distortion function should be re-activated. In other words, there are at least two DPD states in time that represent the beginning and end of the burst that represent the behaviour change of a non-linear device. It will be appreciated that, in most situations, there will be decreases in power between the initial discrete increase and subsequent increases.

The signal manipulation unit may be configured to store the first set of parameters in the storage unit when the first pre-distortion function stops being applied after the initial power increase, so that the first set of parameters used to start generating the first pre-distortion function shortly before the subsequent power increase correspond to those at the end of the predetermined time period after the initial power increase.

This approach enables the first pre-distortion function for subsequent power increases to "learn" from previous power increases. Rather than returning to the same parameters as used at the beginning of the previous transient, the first pre-distortion function can use the parameters stored at the end of the previous transient period.

By comparison, the second set of parameters used when the digital pre-distortion unit starts generating the second pre-distortion function may correspond to the first set of parameters when the digital pre-distortion unit stops generating the first pre-distortion function. In other words, the second pre-distortion function may start from where the first pre-distortion function leaves off.

The signal may be in the form of a plurality of discrete bursts, with each power increase corresponding to the start of a burst.

The pre-distortion functions may be generated from a LUT, or using polynomials having coefficients populated by the parameters.

The pre-distortion unit may be configured to generate and apply a plurality of different pre-distortion functions using a plurality of different sets of parameters to compensate for different power conditions in the non-linear device.

The non-linear device may be a PA for amplifying the signal. The signal manipulation unit may be provided in a network element, optionally a Base Station, which may operate in Time Division Duplex mode.

In accordance with another aspect of the present invention there is provided a method of compensating for nonlinearities in a non-linear device for manipulating a signal. Shortly before an initial discrete power increase is applied to the device, a first pre-distortion function is generated on the basis of a first set of parameters and applied to the signal before it reaches the device. A predetermined time period after the initial power increase, the first pre-distortion function stops being applied to the signal, and a second pre-distortion function is generated on the basis of a second set of parameters and applied to the signal. Shortly before a subsequent discrete power increase is applied to the device, the first pre-distortion function is generated on the basis of the first set of parameters and applied to the signal.

The invention also provides a computer program comprising computer readable code which causes a signal manipulation unit to operate as the signal manipulation unit described above or carry out the method described above.

The invention also provides a computer program product comprising a computer readable medium and a computer program as just described stored on the computer readable medium.

BRIEF DESCRIPTION OF THE DRAWINGS

Some preferred embodiments of the invention will now be described by way of example only and with reference to the accompanying drawings, in which.

DETAILED DESCRIPTION

Figure 1:
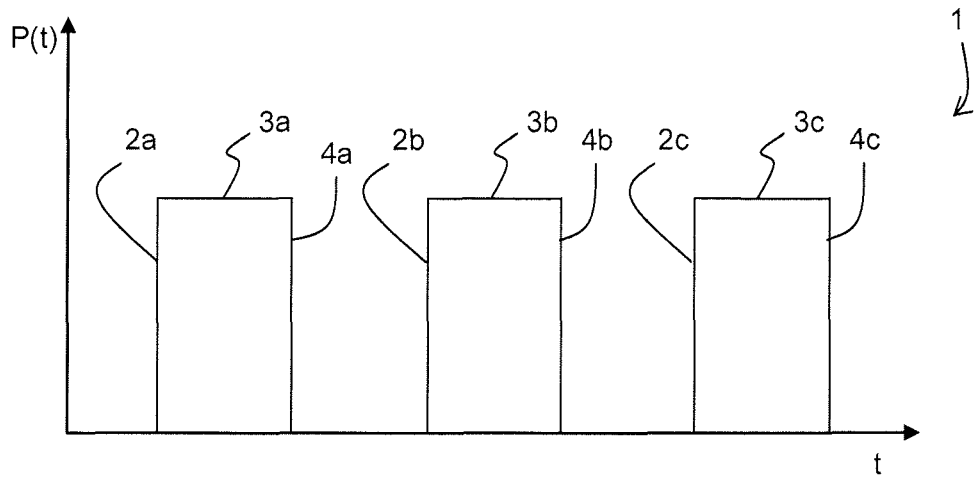
FIG. 1 is an illustration of the power output of a power amplifier in a base station operating TDD over time.
Figure 2:
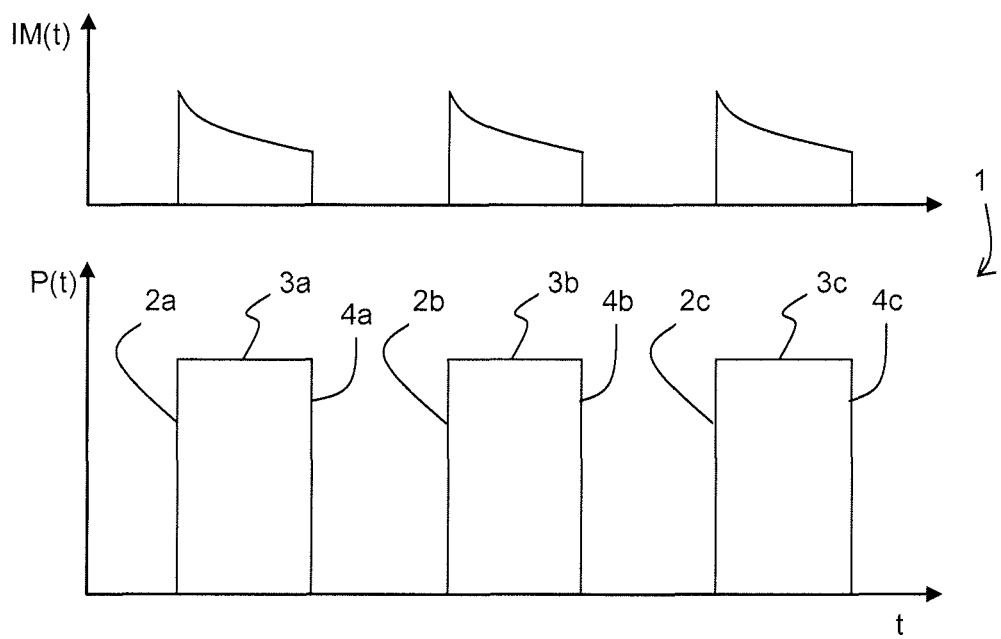
FIG. 2 illustrates the reduction in IM through each burst where a steady state DPD function is used.

A Digital Pre-Distortion is generally made up of a Pre-Distorter and an Adaptation algorithm. The Pre-Distorter is usually built of LUT blocks (or a set of polynomial coefficients) that contain the inverse nonlinear information of the PA. PA behaviour changes when the signal drops down to low power levels, with a number of time constants. Similar behaviour happens when a signal jumps to high power (as shown in FIG. 1). A DPD that is adapted for low power PA behaviour will not be good for a high power PA behaviour. The same is true the other way around, although there is only a problem with the transient when the signal power jumps up to the highest power level. All the other power variations will give a lower IM transient and will not overall be higher than the IM at the maximum power. Power variations that are slower than the DPD update rate are taken care of the DPD updating itself.

The DPD update rate is constructed to compensate for the PA Behaviour variation introduced from the power varying signal. In the TDD operation this change is not continuous: instead, the signal is made up of bursts 3a, 3b, 3c and includes transient "step" changes 2a, 4a, 2b, 4b, 2c, 4c as shown in FIG. 1. As discussed above, if the DPD starts each burst with the last known information of the PA behaviour from the end of previous burst, an increase in IM will result. This is because the end of the previous burst is compensation for a high power characteristic of the PA, but the PA has undergone a shut down in-between. This correction will not be sufficient to reduce the entire IM and a transient IM will be left until either the DPD is updated or the PA behaviour changes back to the adapted state.

Figure 3:
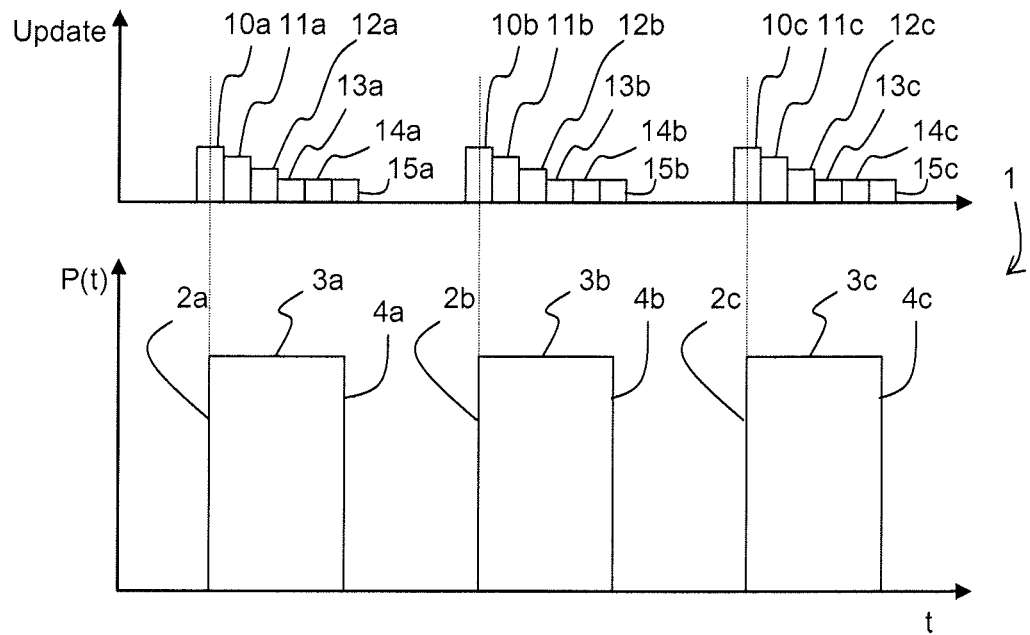
FIG. 3 illustrates the division of the time of the transmitted burst into subsets.

One way to overcome this problem is to divide the time of the transmitted burst into several subsets. Each time subset is associated with a set of DPD parameters designed to model the compensation of the PA behavior for that particular part of the transmitted burst. The DPD parameters for the start of the burst will be different to those for later on in the burst. This can be understood by reference to FIG. 3. Shortly before the power is due to be applied 2a to the PA, a transient DPD 10a (with transient specific parameters in a LUT or polynomials) is applied. This is only applied for a short time, before being replaced by other DPD functions 11a, 12a, 13a, 14a, 15a with different parameters. The same approach is used for subsequent bursts (with DPD parameters 10b ... 15b and 10c ... 15c).

The advantage of this is that it does not require a time critical algorithm, but the disadvantage is that it requires a lot of memory to represent and write all of the subsets. The most obvious disadvantage of this is the inaccuracy of the compensation due to the variation off the statistical content during the burst.

A more sophisticated approach enables residual IM or transient IM to be reduced using a transient DPD set that is adapted to the start of the transmitted burst. The normal DPD operation will then track down the IM during slow PA behavior change until steady state.

Figure 4:
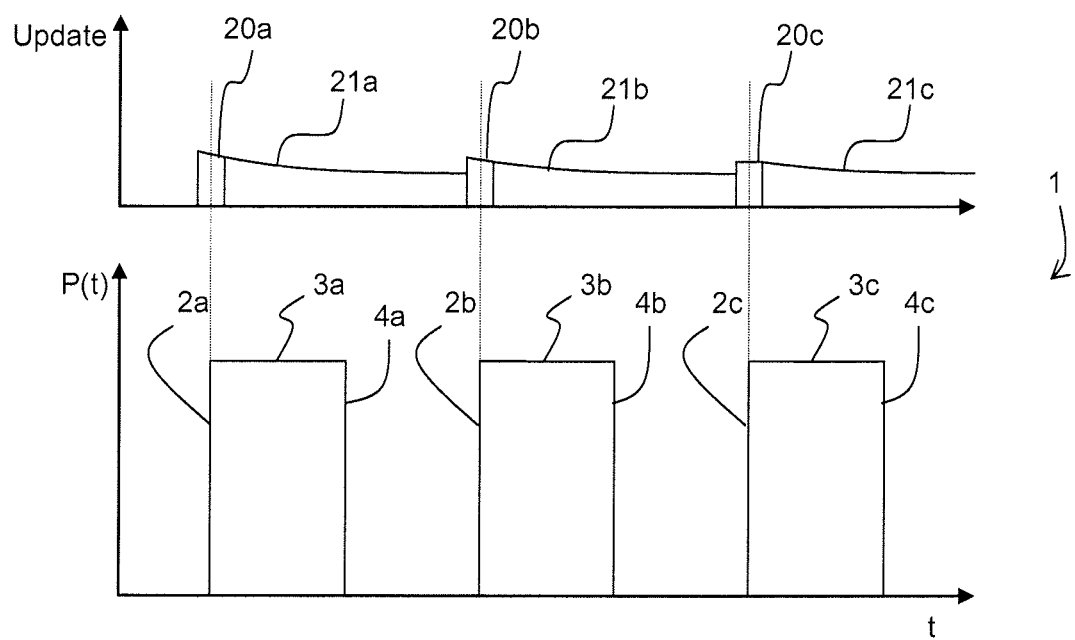
FIG. 4 illustrates the use of "transient" and "normal" DPD functions where each "transient" function learns from the previous burst.

This can be understood with reference to FIG. 4. The DPD has an initial transient setting 20a with an adaptation algorithm fast enough to track the PA behavior in the transient state as it changes in time immediately after the power is applied 2a. The transient setting 20a is applied shortly before the signal jumps up in power 2a (prior to the transient). Before the first burst takes place, the initial parameters for the transient DPD setting 20a are estimated in advance. This transient setting 20a can be seen as a first pre-distortion function generated on the basis of a first set of DPD parameters.

The transient DPD setting 20a adapts very quickly over a short space of time and, once it is converged, eliminates or reduces the transient IM. After a predetermined period of time, short enough to separate "transient" from "normal operation", the finishing parameters of the transient DPD setting 20a (i.e. the values reached after the fast adaptation) are stored away for future use, and a "normal" DPD setting 21a is applied. The initial parameters for the normal DPD setting 21a are those reached at the end of the transient DPD setting 20a. The normal DPD setting (with continuous adaptation) is then applied until the start of the next burst 2b. It will be appreciated that the normal DPD setting can be continued through the point at which the power is switched off 4a: when the signal jumps down the low power results in a much lower IM, so the normal DPD can continue to track the IM despite the step change in power. The normal DPD setting can be seen as a second pre-distortion function generated on the basis of a second set of DPD parameters.

When the next burst is applied, the transient DPD setting 20b is again applied just before the power is applied 2b. However, this time the initial parameters are those saved at the end of the previous transient DPD setting 20a. This means that the transient DPD setting for the transient period has "learned" from the corresponding period of the previous burst. The transient DPD setting 20b again adapts quickly over time, and again the parameters are saved at the end of a short predetermined time, with the normal DPD setting 21b taking over, starting with the parameters from the transient DPD setting 20b.

This process is then repeated for all bursts. The different types of setting can be considered as long or short term memories. The parameters from the end of one transient DPD setting 20a, 20b are remembered for the start of the next transient setting 20b, 20c (long term memory). The parameters for the start of each normal DPD setting 21a, 21b, 21c are taken from the end of the immediately preceding transient DPD setting 20a, 20b, 20c (short term memory).

Figure 5:
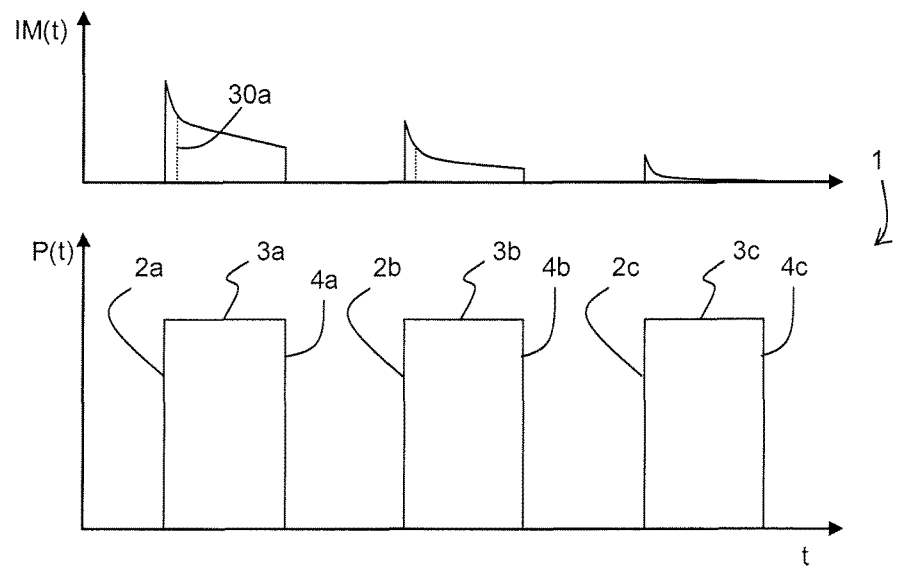
FIG. 5 is a schematic representation of the effect on IM of the learned behaviour of the transient and normal DPD settings.

FIG. 5 is a schematic representation of the effect on IM of the learned behaviour of the transient and normal DPD settings. It can be seen that the IM for the first burst starts high (if the initial parameter estimation has been poor) but falls quickly to the end 30a of the period in which the transient DPD setting is first applied. At the start of the second burst 2b the IM does not rise as far, because of the behaviour learned from the first burst. At the start of the third burst 2c the learned parameters are more accurate still and the IM barely increases.

It will be appreciated that the above description describes two DPD settings, but the concept can be extended to additional sets of parameters, each compensating for a specific time constant of the PA behaviour.

This is a technique that gives optimum performance in transient operation and superior precision. The memory requirement is low but the algorithm requirement is high.

Figure 6:
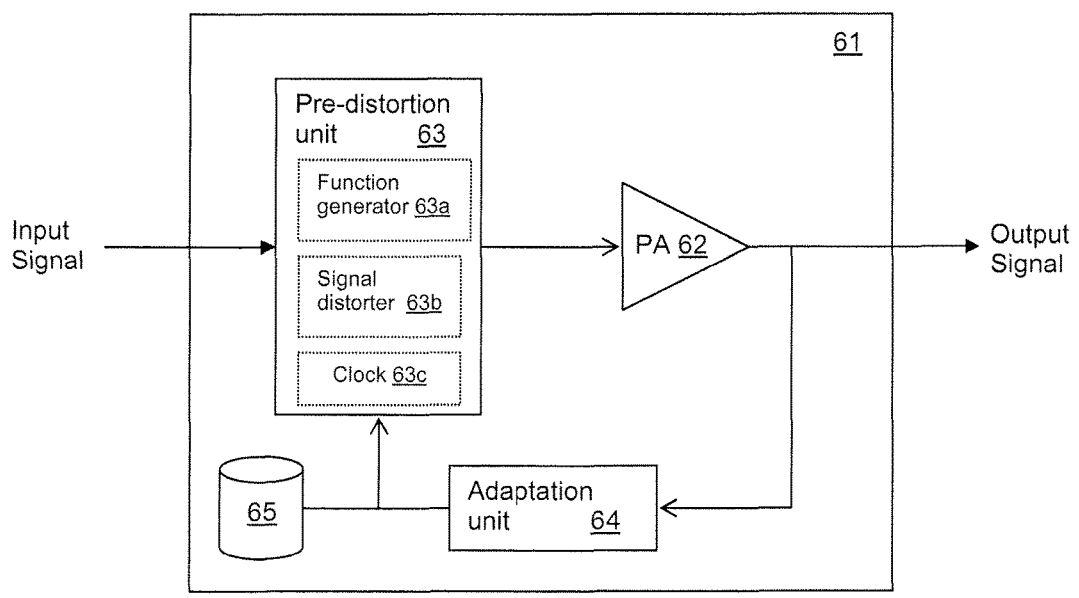
FIG. 6 is a schematic representation of a signal manipulation unit.

FIG. 6 is a schematic representation of a signal manipulation unit 61, which could be included in a network node such as a base station or user equipment. The signal manipulation unit comprises a PA 62 for amplifying the signal. A digital pre-distortion unit 63 includes a function generator 63a which generates a DPD function on the basis of stored DPD parameters, a signal distorter 63b which applies the DPD function to the signal before it reaches the PA, and a clock 63c which monitors the length of time from a sharp power increase. It will be appreciated that the function generator 63a, signal distorter 63b and clock 63c may simply be functional units of a single entity. An adaptation unit 64 receives feedback from an output of the PA and adjusts the DPD parameters so as to optimise the pre-distortion and minimise IM. The DPD parameters are stored in a storage unit 65.

Figure 7:
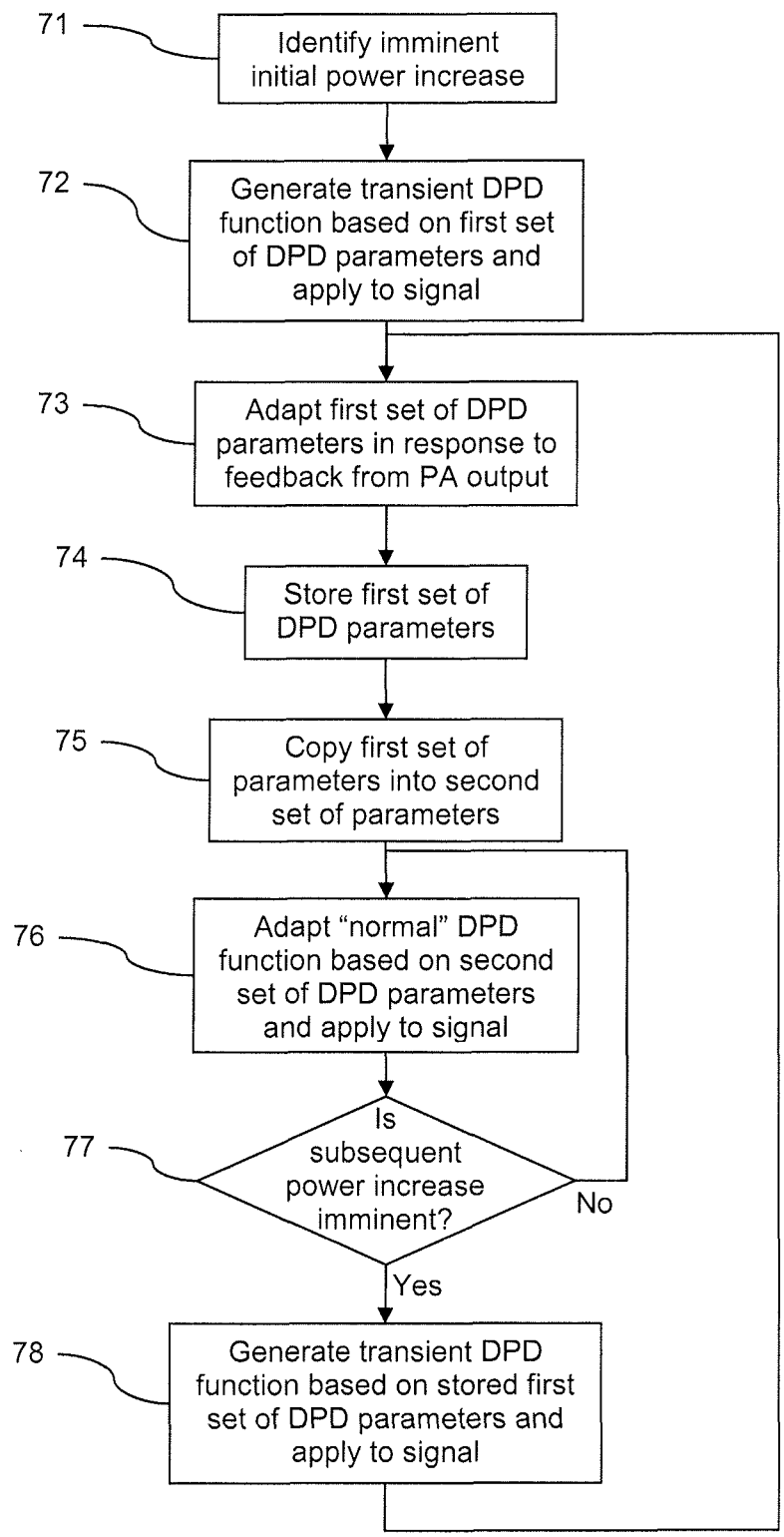
FIG. 7 is a flow chart illustrating the steps involved in pre-digital distortion of a power burst in a non-linear device.

FIG. 7 is a flow chart illustrating the steps involved in pre-digital distortion of a power burst in a non-linear device. When an imminent power increase is identified 71 (normally the beginning of a burst 2a), a "transient" DPD function is generated based on a first set of parameters, and applied to the signal entering the PA 72. These parameters are adapted 73 in response to a feedback loop from the output of the PA so as to optimise the transient DPD function.

A predetermined time after the start of the burst 2a, the first set of DPD parameters are stored 74 for future use. The values in the first set of DPD parameters are copied into a second set 75, which are used as starting values in the process of adaptation of a "normal" DPD function, which is applied to the signal 76 until the next time a power increase is expected. The next time a power increase is expected 77 (e.g. just before the start of the next burst 2b), a transient DPD function is generated 78 using as initial parameters the first set stored at step 74 when operation switched from "transient" to "normal". The process then repeats.

It will be appreciated that variations from the above described embodiments may still fall within the scope of the invention. For example, the operation of a PA, generally for use in a base station, has been described. However, the approach can be used for any non-linear device used to manipulate a signal, such as for example a frequency mixer.

Furthermore, the approach has generally been described in the context of a "bursty" signal where the power applied approximates a square wave. It will be appreciated that the same approach can be used in any situation where there is a sharp increase in power after a period in a steady state, so that temperature, charge etc. has stabilised. Thus it may apply to devices having a number of different power levels, for example.

The invention claimed is:

1. A signal manipulation unit for use in a network element of a telecommunications network, comprising:
   a non-linear device for manipulating a signal;
   a digital pre-distortion unit adapted to generate a pre-distortion function, using a set of stored parameters, and to apply the pre-distortion function to the signal before it reaches the non-linear device so as to compensate for nonlinearities in the device;

an adaptation unit adapted to receive feedback from an output of the non-linear device and to adapt the parameters in response to the received feedback; and a storage unit for storing the parameters used by the pre-distortion unit to generate the pre-distortion function;

wherein the digital pre-distortion unit comprises:

a function generator configured to generate a first pre-distortion function on the basis of a first set of parameters shortly before an initial discrete increase in power applied to the non-linear device;

a signal distorter for applying the pre-distortion function to the signal; and a clock for determining a time period having a predetermined length and beginning with the initial discrete increase in power;

and wherein the pre-distortion unit is configured so that, at the end of the time period having the predetermined length, the signal distorter stops generating the first pre-distortion function, and starts generating a second pre-distortion function generated on the basis of a second set of parameters; and shortly before the start of a subsequent discrete increase in power applied to the device, the signal distorter starts generating the first pre-distortion function on the basis of the first set of parameters.

2. The signal manipulation unit of claim 1, configured to store the first set of parameters in the storage unit when the first pre-distortion function stops being generated after the initial power increase, so that the first set of parameters used to start generating the first pre-distortion function shortly before the subsequent power increase correspond to those at the end of the predetermined time period after the initial power increase.

3. The signal manipulation unit of claim 1, configured so that the second set of parameters used when the function generator starts generating the second pre-distortion function corresponds to the first set of parameters when the function generator stops generating the first pre-distortion function.

4. The signal manipulation unit of claim 1, wherein the signal manipulation unit is configured to act on a signal received by the unit in a plurality of discrete bursts, each power increase corresponding to the start of a burst.

5. The signal manipulation unit of claim 1, wherein the function generator is configured to generate the first and second pre-distortion functions from a look-up table stored in the storage unit.

6. The signal manipulation unit of claim 1, wherein the function generator is configured to generate the first and second pre-distortion functions using polynomials having coefficients populated by the first and second sets of parameters.

7. The signal manipulation unit of claim 1, wherein the function generator is configured to generate and apply a plurality of different pre-distortion functions using a plurality of sets of parameters to compensate for different power conditions in the non-linear device.

8. The signal manipulation unit of claim 1, wherein the non-linear device is a power amplifier for amplifying the signal.

9. A network element comprising the signal manipulation unit of claim 1.

10. The network element of claim 9, wherein the network element is a Base Station.

11. The network element of claim 9, configured to operate in Time-Division Duplex mode.

12. A method of compensating for nonlinearities in a non-linear device for manipulating a signal, the method comprising:

shortly before an initial discrete power increase is applied to the non-linear device, generating a first pre-distortion function on the basis of a first set of parameters and applying the first pre-distortion function to the signal before it reaches the non-linear device;

at the end of a time period having a predetermined length and beginning with the initial discrete increase in power, stopping applying the first pre-distortion function, generating a second pre-distortion function on the basis of a second set of parameters, and applying the second pre-distortion function to the signal; and shortly before a subsequent discrete power increase is applied to the non-linear device, generating the first pre-distortion function on the basis of the first set of parameters and applying the first pre-distortion function to the signal.

13. The method of claim 12, further comprising:

adapting the first set of parameters in response to feedback from an output of the device while the first pre-distortion function is applied to the signal;

when the first pre-distortion function is stopped at the end of the predetermined time period after the initial power increase, storing the first set of parameters;

when the first pre-distortion function is generated again shortly before the subsequent power increase, starting such generation using the stored set of parameters.

14. The method of claim 12, wherein the second set of parameters used when the digital pre-distortion unit starts generating the second pre-distortion function correspond to the first set of parameters when the digital pre-distortion unit stops generating the first pre-distortion function.

15. The method of claim 12, wherein the signal is formed by a plurality of discrete bursts, each discrete power increase corresponding to the start of a burst.

16. A non-transitory computer-readable medium comprising a computer program stored thereupon, the computer program comprising instructions that, when executed by a processor associated with a non-linear device, cause the processor to manipulate a signal by:

shortly before an initial discrete power increase is applied to the non-linear device, generating a first pre-distortion function on the basis of a first set of parameters and applying the first pre-distortion function to the signal before it reaches the non-linear device;

at the end of a time period having a predetermined length and beginning with the initial discrete increase in power, stopping applying the first pre-distortion function, generating a second pre-distortion function on the basis of a second set of parameters, and applying the second pre-distortion function to the signal; and shortly before a subsequent discrete power increase is applied to the non-linear device, generating the first pre-distortion function on the basis of the first set of parameters and applying the first pre-distortion function to the signal.

* * * * *